United States Patent [19]

Tsuda et al.

[11] 4,210,861
[45] Jul. 1, 1980

[54] FOURIER-TRANSFORM NUCLEAR GYROMAGNETIC RESONANCE SPECTROMETER

[75] Inventors: Munetaka Tsuda; Hiroshi Yokokawa, both of Ibaraki; Yoshiharu Utsumi, Tokyo, all of Japan

[73] Assignee: Hitachi, Ltd., Japan

[21] Appl. No.: 924,721

[22] Filed: Jul. 14, 1978

[30] Foreign Application Priority Data

Jul. 21, 1977 [JP] Japan .................................. 52-88020
Aug. 12, 1977 [JP] Japan .................................. 52-96009

[51] Int. Cl.² ........................................... G01R 33/08
[52] U.S. Cl. .................................... 324/308; 324/307
[58] Field of Search ........... 324/0.5 R, 0.5 A, 0.5 AC

[56] References Cited

U.S. PATENT DOCUMENTS

| | | | |
|---|---|---|---|
| 3,753,081 | 8/1973 | Freeman | 324/0.5 A |
| 3,968,424 | 7/1976 | Ernst | 324/0.5 AC |
| 4,081,742 | 3/1978 | Hofer | 324/0.5 A |

Primary Examiner—M. Tokar
Attorney, Agent, or Firm—Craig & Antonelli

[57] ABSTRACT

Continuous high-frequency waves and pulse-like high-frequency waves of the same frequency are selectively applied to a specimen placed in a unidirectional magnetic field, whereby resonance signals and free induction decay signals are selectively produced by the specimen. These signals are detected, and the detected free induction decay signals are Fourier-transformed, so that the continuous wave nuclear gyromagnetic resonance and the Fourier-transformed nuclear gyromagnetic resonance can be selectively measured.

10 Claims, 6 Drawing Figures

FOURIER-TRANSFORM NUCLEAR GYROMAGNETIC RESONANCE SPECTROMETER

BACKGROUND OF THE INVENTION

(1) Field of the Invention

The present invention is related to a Fourier-transform nuclear gyromagnetic resonance spectrometer, and particularly to a Fourier-transform nuclear gyromagnetic resonance spectrometer which is also capable of measuring the nuclear gyromagnetic resonance of continuous waves.

(2) Description of the Prior Art

An atomic nucleus of which center of gravity is at rest has a given angular momentum which is often called nuclear spin. The nuclear spin of the atomic nucleus is given by $h\vec{I}/2\pi$, and the magnetic moment is given by $\gamma h/2\pi \vec{I}$, where h represents Plank's constant, I the spin quantum number, and $\gamma$ a constant (gyromagnetic ratio) specific to the nucleus, which is ½ for $1_H$, $19_F$, $13_C$, $31_P$, and 1 for $14_N$. The presence of angular momentum or the accompanying magnetic moment in the atomic nucleus represents that the nucleus is spinning. If the spinning atomic nucleus is placed in a unidirectional magnetic field, the nuclear spin is so polarized that the direction possessed by the spinning axis is restricted to either the direction of the magnetic field or the direction opposite thereto, and the magnetic moment performs the precession about the spinning axis. The energy of the nuclear spin is given by the product of the magnetic moment and the magnetic field, but the nuclear spin is separated into a plurality of energy levels (Zeeman effect) to exhibit Boltzmann's distribution. Therefore, if electromagnetic waves corresponding to the difference between a high energy level and the next high energy level are radiated at right angles to the magnetic field, the electromagnetic waves are absorbed (resonance absorption) causing the nuclear spin to be transited from a low level to a high level. The condition in which the resonance absorption takes place is given by $\omega = \gamma H$, where $\omega$ represents an angular frequency of the electromagnetic wave and H represents the intensity of the unidirectional magnetic field. According to the above relation, the resonance takes place at the same frequency as far as the nucleus is the same, and no other effective applications are obtained than to detect the above-said nucleus.

The atomic nucleus to be practically measured does not exist naked but is occupying its position in a particular molecule. Therefore, even when dealing with homonuclei, the atomic nuclei exhibit shifting resonance frequencies depending upon whether they are present naked or not, being caused by the magnetic shield established by the electrons encircling the nucleus and by other neibouring nuclear spins. Therefore, the relation $\omega_1 = \gamma H(1-\sigma) + \Delta\omega_J$ is practically applied to the nucleus in the molecule, where $\omega_1$ denotes a resonance frequency of a naked nucleus, a screeing constant, and $\Delta\omega_J$ a frequency shift corresponding to a spin-spin coupling energy. The term $\gamma H(1-\sigma) = \Delta\omega = \delta$ of this equation is called chemical shift. The symbol $\delta$, however, is not a shift of the naked nucleus, but denotes a shift found from the resonance of a nucleus of a particular molecule (TMS [tetramethylsilane] in the case of a proton). Therefore, if the screening constant of the nucleus of a reference substance is denoted by $\sigma\gamma$, the chemical shift is given by $\delta = \gamma H(\sigma - \sigma\gamma)$.

The resonance occurs in the region of radio waves, and this serves as an added source of energy. As there develops resonance absorption in the radio waves, the absorbed energy appears in the form of a change in magnetization as a whole nuclear spin. This appears not only in the direction (direction Z) of the unidirectional magnetic field but also appears in the form of a gyrational change in a plane (plane X-Y) at right angles thereto. The change in gyrational magnetization further works to change the impedance of a coil which is magnetically coupled to the nuclear spin to give a high-frequency energy to the nucleus. Accordingly, the change in gyrational magnetization can be measured by an impedance-bridge method (single-coil method) and the like. Another method (cross-coil method) for measuring the change in gyrational magnetization will consist of placing a detector coil which crosses a radiation coil in a plane X-Y, to detect the voltage induced in the detector coil by said change in gyrational magnetization.

One of the principal objects of the nuclear gyromagnetic resonance spectrometer is to measure the aforesaid chemical shift which gives a clue for determining the molecular structures. The nuclear gyromagnetic resonance spectrometers may be classified into those of the type in which either one of the high-frequency wave or the magnetic field is fixed and the other is continuously changed, and those of the type in which the magnetic field is fixed and the high-frequency waves applied to the specimen is pulse-modulated. The former devices, in contrast to the latter devices, are in many cases called continuous wave nuclear gyromagnetic resonance spectrometers, and the latter devices are called Fourier-transform nuclear gyromagnetic resonance spectrometers. With the Fourier-transform nuclear gyromagnetic resonance spectrometer, a plurality of homonuclei are simultaneously resonated to detect the resulting transient resonace signals which are called free induction decay signals. Here, since the transient resonance signals contain resonance frequency components within a frequency range given by an inverse number of a pulse width when the high-frequency is to be pulse-modulated, the transient resonance signals are Fourier-transformed to obtain nuclear gyromagnetic resonance spectrum within the range of said frequencies. When used in combination with a signal accumulating device, the Fourier-transform nuclear gyromagnetic resonance spectrometer makes it possible to obtain the nuclear gyromagnetic resonance spectrum having improved signal to noise ratio within reduced period of time, thus giving advantages superior to the continuous wave nuclear gyromagnetic resonance spectrometers. The Fourier-transform nuclear gyromagnetic resonance spectrometers have, therefore, been increasingly used in recent years.

The nuclear gyromagnetic resonance spectrometers must have high resolving power to measure small chemical shifts and must also have a function to adjust the resolving power such that desired resolving power can be attained. The resolving power can be adjusted by correcting the non-uniformity in the magnetic field. The magnitude of peak and upsurge of the nuclear gyromagnetic resonance spectrum, width, symmetry, expansion of foot of the peak, play important roles for determining the quality of the resolving power. Hence, the resolving power can be accurately and easily adjusted if the non-uniformity of the magnetic field is so corrected that the abovesaid factors fall under optimum conditions while observing the spectrum. With the Fourier-transform nuclear gyromagnetic resonance spectrometer which requires several seconds for performing the Fourier-transform, however, it is virtually very difficult to correct the non-uniformity of the magnetic field in order to adjust the resolving power while observing the display of the spectrum. With the Fourier-transform nuclear gyromagnetic resonance spectrometer, therefore, the resolving power is often adjusted by observing the display of free induction decay signal waveforms before being Fourier-transformed. In practice, however, the display of free induction decay signal waveforms merely yields information which is related to the magnitude of the peak of spectrum, from which it is virtually impossible to accurately adjust the resolving power.

SUMMARY OF THE INVENTION

It is an object of the present invention to provide a Fourier-transform nuclear gyromagnetic resonance spectrometer which is suited for easily and accurately adjusting the resolving power.

Another object of the present invention is to provide a Fourier-transform nuclear gyromagnetic resonance spectrometer which is suited to be assembled in a small size.

A further object of the present invention is to provide a Fourier-transform nuclear gyromagnetic resonance spectrometer which is suited for easily selecting high-frequency waves with which the specimen will be irradiated, and for stabilizing the resonance conditions.

According to the present invention, there is provided a Fourier-transform nuclear gyromagnetic resonance spectrometer comprising means for establishing a unidirectional magnetic field, means for placing a specimen in said unidirectional magnetic field, means for generating pulse-like high-frequency waves as well as continuous high-frequency waves having substantially the same frequency as the frequency of said pulse-like high-frequency waves, means for selectively supplying said pulse-like high-frequency waves and continuous high-frequency waves to said specimen so that said specimen will selectively generate resonance signals and free induction decay signals, means for detecting said resonance signals and free induction decay signals, and means for Fourier-transforming said detected free induction decay signals.

The aforementioned objects and features of the present invention, and still other objects and features of the present invention will become obvious from the below-mentioned description in conjunction with the accompanying drawings.

DESCRIPTION OF THE PREFERRED EMBODIMENTS

Figure 1:
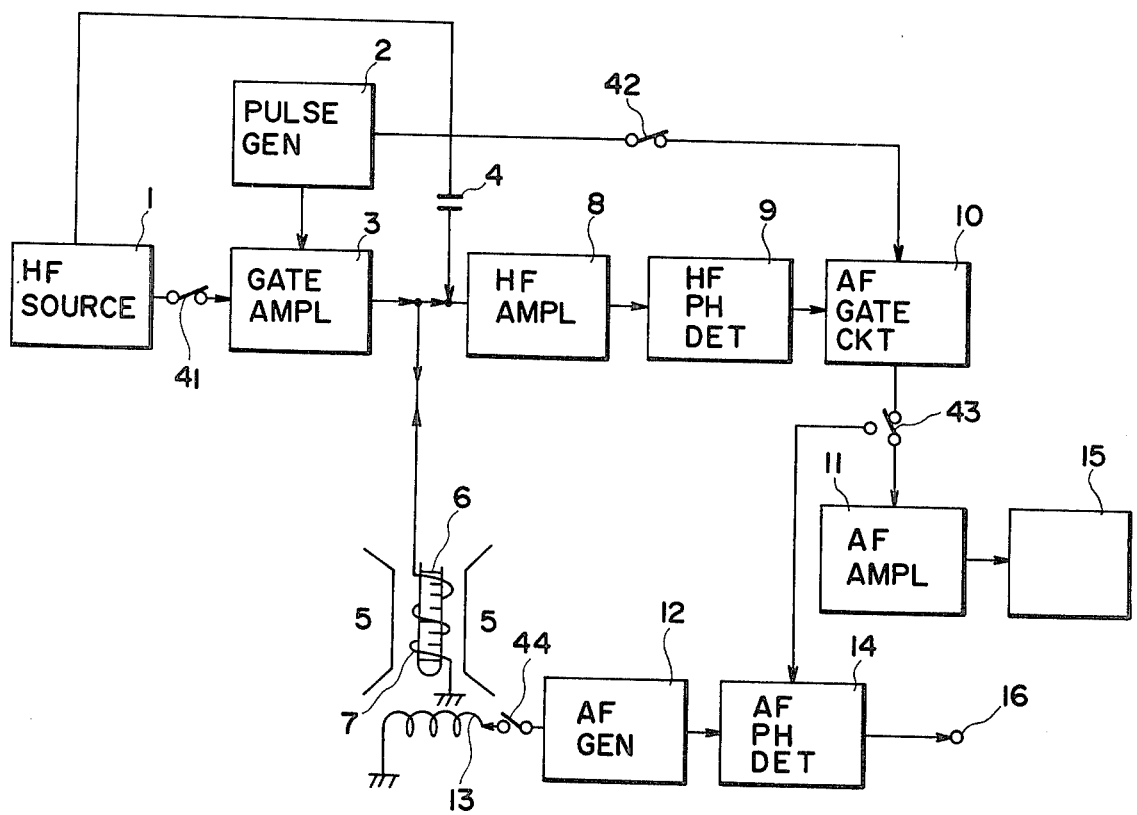
FIG. 1 is a block diagram of a Fourier-transform nuclear gyromagnetic resonance spectrometer which represents an embodiment according to the present invention.

FIG. 1 is a diagram showing an embodiment according to the present invention. The measurement of Fourier-transform nuclear gyromagnetic resonance of a specimen containing hydrogen nuclei is illustrated below with reference to FIG. 1. High-frequency waves of 60 megahertz obtained from a high-frequency source 1 via a switch 41 are amplified by a gate amplifier 3 only while the gate of said gate amplifier 3 is opened by the pulse signals generated by a pulse generator 2. Therefore, the gate amplifier 3 produces high-frequency waves of, for example, 60 megahertz that are pulse-modulated. The high-frequency waves are applied via a coil 7 to a specimen 6 contained in a speciment tube which is placed in a unidirectional magnetic field of, for example, 14100 gauss established in a gap defined by magnets 5 and 5. The hydrogen nuclei contained in the speciment 6 are resonated by the application of high-frequency waves. The frequency range of the resonance is given by an inverse number of a time width in which the gate of the gate amplifier 3 is open. The thus produced resonance is detected in the form of a signal by the coil 7, and the resonance signal is fed to a high-frequency phase detector 9 through a high-frequency amplifier 8. Here, a leak homodyne detection is performed using, as a reference signal, the high-frequency waves of 60 megahertz fed to the high-frequency phase detector 9 from the high-frequency source 1 via a coupling capacitor 4 and the high-frequency amplifier 8, such that the resonance signals over a range of audio-frequencies are obtained from the high-frequency phase detector 9. The resonance signals can be continuously obtained even while high-frequency waves are not applied to the specimen 6; the resonance signals during such a period, however, tend to be attenuated with the lapse of time. Such signals are usually called free induction decay signals. The signals from the detector 9 are fed to an audiofrequency gate circuit 10. The gate of the audiofrequency gate circuit 10 is opened by the pulse signals obtained from the pulse generator 2 via a switch 42, but only when the gate of the gate amplifier 3 is closed. Therefore, free induction decay signals over the range of audiofrequencies are obtained from the autio frequency gate circuit 10. The free induction decay signals are fed to an audiofrequency amplifier 11 via a switch 43 and amplified. The amplified free induction decay signals are then fed to a Fourier-transform device 15 which perform the Fourier-transformation for obtaining nuclear gyromagnetic resonance signals from the free induction decay signals. The nuclear gyromagnetic resonance signals obtained by the Fourier-transformation are guided to a desplay device or a recording device (not shown), and displayed or recorded.

In the case of the continuous wave nuclear gyromagnetic resonance measurement, on the other hand, the switches 41 and 42 are opened, the switch 44 is closed, and further the switch 43 is so changed that the autiofrequency gate circuit 10 and an audiofrequency phase detector 14 are connected together. Therefore, high-frequency waves of 60 megahertz from the high-frequency source 1 are continuously applied to the specimen 6 through the coupling capacitor 4 and the coil 7. The low-frequency waves of, for example, 15 kilohertz from an audiofrequency generator 12 are applied via a switch 44 to a coil 13 placed in the unidirectional magnetic field of 14100 gauss, whereby the magnetic field is modulated with an audiofrequency of 15 kilohertz. The audiofrequency will be varied within a range of, for example, ±1 kilohertz. If the resonance of hydrogen nuclei in the specimen 6 takes place under such a state, the resonance signals are detected by the coil 7 and supplied to the high-frequency phase detector 9 via the high-frequency amplifier 8. Here, in the same manner as mentioned in the foregoing, the leak homodyne detection is carried out and, as a result, the resonance signals of the frequency of magnetic field modulation are obtained therefrom. The resonance signals pass through the audiofrequency gate circuit 10 and fed to the audiofrequency phase detector 14 via the switch 43. Being served with the audiofrequency of the audiofrequency generator 12 as reference signals, the audiofrequency phase detector 14 detects the resonance signals of the frequency of magnetic field modulation and converts them into direct-current signals. The direct-current signals are fed from the output terminal 16 to the display device or the recording device (not shown), such that the resonance spectrum is displayed or recorded.

In the case of the continuous wave nuclear gyromagnetic resonance measurement employing the high-frequency waves of an amplitude smaller than that of the Fourier-transform nuclear gyromagnetic resonance measurement, it is desired that the high frequency source 1 is so constructed as to be able to vary the amplitude of the high-frequency waves. Instead of varying the amplitude of the high-frequency waves, the gain of the gate amplifier may be varied.

According to the embodiment shown in FIG. 1 which is capable of performing both the Fourier-transform nuclear gyromagnetic resonance measurement and the continuous wave nuclear gyromagnetic resonance measurement, it is allowed to adjust the resolving power necessary for measuring the Fourier-transform nuclear gyromagnetic resonance utilizing the system of continuous wave nuclear gyromagnetic resonance measurement prior to performing the measurement. The adjustment of the resolving power through the observation of nuclear gyromagnetic resonance spectrum obtained by the continuous wave nuclear gyromagnetic resonance measurement, is not so cumbersome as the adjustment of resolving power through the observation of nuclear gyromagnetic resonance spectrum obtained by the Fourier-transform nuclear gyromagnetic resonance measurement. Further, the nuclear gyromagnetic resonance spectrum gives information necessary for accurately adjusting the resolving power, such as the magnitude of spectrum peak, width, symmetry, expansion of foot of the peak and upsurging, that were not expected from the free induction decay signals. Accordingly, the embodiment shown in FIG. 1 makes it possible to easily and accurately adjust the resolving power.

The adjustment of the resolving power is performed principally by correcting the non-uniformity of the unidirectional magnetic field. FIG. 1, however, does not show the means for correcting the non-uniformity of the magnetic field.

In performing the continuous wave nuclear gyromagnetic resonance measurement, the resonance of nuclei different from the nuclei used for the Fourier-transform nuclear gyromagnetic resonance measurement, such as the resonance of the deutrium nuclei can be utilized. When such heterocuclei are to be used, however, it will be necessary to provide an extra coil for such nuclei. The provision of an extra coil, however, causes the gap of the magnets to be increased. Consequently, the provision of the extra coil in the magnetic field can become a cause of fatal defect in assembling a small Fourier-transform nuclear gyromagnetic resonance spectrometer. Further, in measuring the Fourier-transform nuclear gyromagnetic resonance of the hydrogen nuclei, it is impossible to accurately adjust the resolving power if the continuous wave nuclear gyromagnetic resonance of the deutrium nuclei is measured to adjust the resolving power, because the width of spectrum peak of the deutrium nucleus is about 3 times broader than that of the hydrogen nucleus.

However, according to the embodiment shown in FIG. 1 which is capable of measuring the homonucleus by means of both the Fourier-transform nuclear gyromagnetic resonance and the continuous wave nuclear gyromagnetic resonance, the aforementioned problems are completely eliminated.

The embodiment shown in FIG. 1 employs the leak homodyne detection system which superposes the pulse-like signals having inherently sharp rising characteristic on the initial portions of the free induction decay signals that are to be fed to the Fourier-transform device. In the Fourier-transform nuclear gyromagnetic resonance spectrometer, the free induction decay signals are accumulated prior to effecting the Fourier-transformation in order to obtain a nuclear gyromagnetic resonance spectrum having a high signal to noise ratio. After accumulated, however, the aforesaid pulse-like signals are augmented. Therefore, if the pulse-like signals are Fourier-transformed together with the free induction decay signals, the base line of the resulting nuclear gyromagnetic resonance spectrum is undulated, causing the quality of the spectrum to be deteriorated. This is a problem presented by the embodiment of FIG. 1. To solve this problem, a cross-coil method can be proposed. The cross-coil method, however, necessitates a coil for applying high-frequency waves to the specimen and a coil for detecting the resonance. Accordingly, the cross-coil method gives a decisively fatal defect in assembling a small Fourier-transform nuclear gyromagnetic resonance spectrometer.

Figure 2:
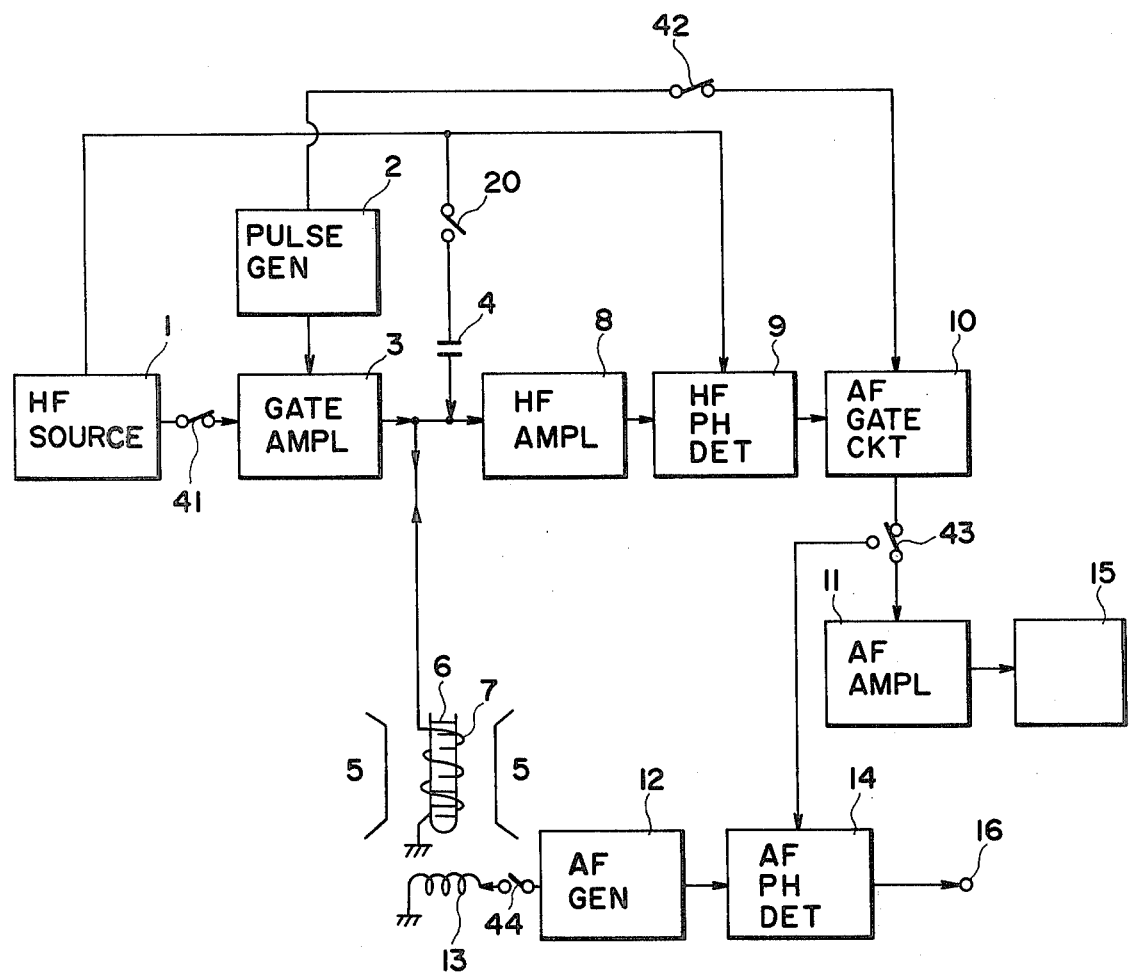
FIG. 2 is a block diagram of a Fourier-transform nuclear gyromagnetic resonance spectrometer which represents another embodiment according to the present invention.

Such a problem can be solved by an embodiment shown in FIG. 2. Referring to FIG. 2, the same numerals as those of FIG. 1 represent the same components. The difference of the embodiment of FIG. 2 from the embodiment of FIG. 1 is that the embodiment of FIG. 2 has a switch 20 between the high-frequency source 1 and the coupling capacitor 4 so that the switch 20 is closed only when the continuous wave nuclear gyromagnetic resonance is to be measured, and that the high-frequency waves from the high-frequency source 1 are directly fed as reference signals to the detector 9 so that the high-frequency waves are detected in synchronism therewith. The embodiment of FIG. 2 is the same as the embodiment of FIG. 1 in all other respects. With the synchronized detection, unlike the homodyne detection, the pulse-like signals are not superposed on the initial portion of the free induction decay signals, and the base line of the nuclear gyromagnetic resonance signals after Fourier-transformed is not undulated.

The embodiment of FIG. 2 has switches 41 and 20 for selectively applying the continuous high-frequency waves and the pulse-modulated high-frequency waves to the specimen 6. The same effects, however, can be obtained even if the switch 41 and a system consisting of high-frequency source 1, switch 20, coupling capacitor 4 and high-frequency amplifier 8 are eliminated, thereby so modifying the pulse generator 2 that the gate of the gate amplifier 3 is opened and closed in a pulse fashion and is continuously opened for a period of time necessary for at least adjusting the resolving power.

Although the switches according to FIG. 1 and FIG. 2 have been suggested as if they are mechanical ones, it should be noted that electronically operated switches may of course be employed.

Figure 3:
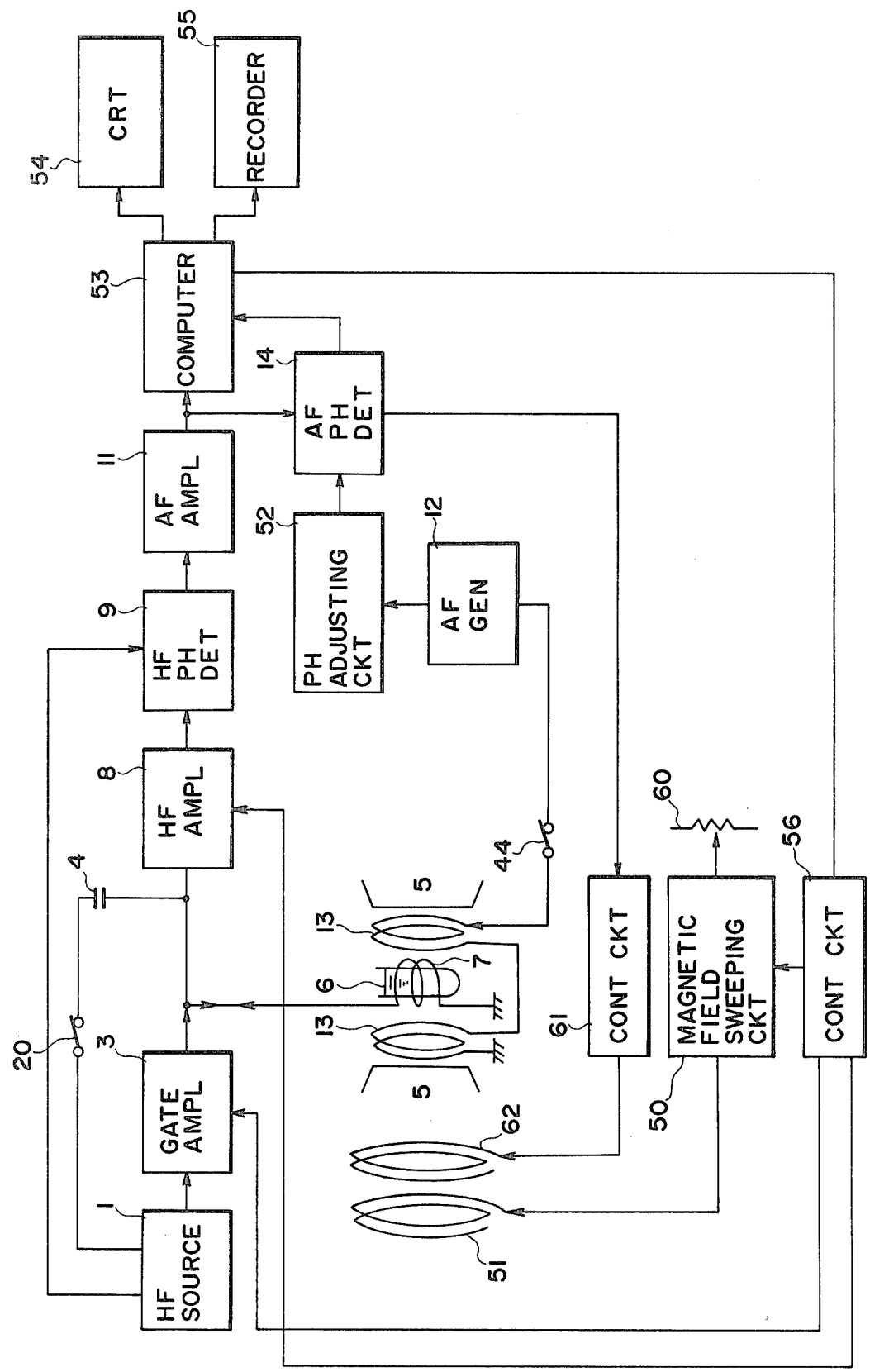
FIG. 3 is a block diagram of a Fourier-transform nuclear gyromagnetic resonance spectrometer which represents a further embodiment according to the present invention.

FIG. 3 shows a further embodiment according to the present invention. In FIG. 3, the same components as those of FIG. 1 and FIG. 2 are represented by the same numerals. In the case of the continuous wave nuclear gyromagnetic resonance measurement, the gate of the gate amplifier 3 is closed, and the switches 20 and 44 are closed. The undirectional magnetic field formed in the gap defined by the magnets 5, 5 is modulated by the audiofrequency fed from the audiofrequency generator 12 to the coils 13 via the switch 44. Under this state, the high-frequency waves from the high-frequency source 1 are continuously applied to the specimen 6 via the switch 20, coupling capacitor 4 and coil 7. Hence, if the unidirectional magnetic field is swept by sweeping signals applied from a magnetic field sweeping circuit 50 to a coil 51, the resonance signals of the specimen 6 can be detected by a coil 6. The resonance signals are amplified by the high-frequency amplifier 8 and fed to the detector 9. The detector 9 detects the resonance signals in synchronium with the high-frequency waves from the high-frequency source 1 as reference signals and produces audiofrequency side-band resonance signal components in the resonance signals. The audiofrequency side-band resonance signal components are fed to the audiofrequency phase detector 14 via an audiofrequency amplifier 11. The audiofrequency phase detector 14 detects the audiofrequency side-band resonance signals with the audiofrequency fed from the audiofrequency generator 12 via a phase adjusting circuit 52 as reference signals and converts them into direct-current signals. The direct-current signals are fed to a cathode-ray tube 54 and a recorder 55 via a computer 53, such that the resonance spectrum is displayed and recorded. The computer 53 functions to integrate the direct-current signals fed thereto well as to accumulate the direct-current signals for averaging. Based upon the command from the computer 53, a controller circuit 56 gives a sweep starting signal to the magnetic field sweeping circuit 50 so that the magnetic field is swept. By adjusting a variable resistor 60 connected to the imput terminal of the magnetic field sweeping circuit 50, the peak of spectrum can be displayed at a desired level determined by the cathode-ray tube 54.

In the case of the Fourier-transform nuclear gyromagnetic resonance measurement, the switches 20 and 44 are opened. Being commanded by the computer 53, on the other hand, the controller circuit 56 feeds the gate signals to the gate amplifier 3 and the high-frequency amplifier 8. The gates of the gate amplifier 3 and the high-frequency amplifier 8 are then opened and closed in opposite phase to each other. Hence, as the high-frequency waves from the high-frequency source 1 are applied to the gate amplifier 3, the gate amplifier 3 produces the output of high frequency in the form of pulses which are applied to the specimen 6. While the gate of the gate amplifier 3 is closed, the free induction decay signals produced from the specimen 6 through the coil 7 are fed to the detector 9 via the high-frequency amplifier 8 and detected, and are then introduced into the computer 53 through the audiofrequency amplifier 11. The free induction decay signals are then accumulated for averaging or Fourier-transformed. As a result, the resonance spectrum is displayed on the cathode-ray tube 54 and recorded in the recorder 55. The free induction decay signals from the audiofrequency amplifier 11 are also fed to the audiofrequency phase detector 14. The audiofrequency phase detector 14 compares the audiofrequency fed from the audiofrequency generator 12 via the phase adjusting circuit 52, as reference signals, with the frequency of the free induction decay signals, and produces error signals of a frequency between said two frequencies. The error signals are fed to the contorller circuit 61 which controls the electronic current flowing into a coil 62 which so produces and controls the unidirectional magnetic field across the magnets 5 and 5 that the error signals will assume a predetermined value. Instead of controlling the current flowing into the coil 62, the controller circuit 61 may also control the oscillating frequency of the high-frequency generator 1. This enables the resonating conditions to be stably maintained.

The embodiment of FIG. 3 is capable of selectively effecting the Fourier-transform nuclear gyromagnetic resonance measurement and the continuous wave nuclear gyromagnetic resonance measurement, and therefore, makes it possible to adjust the resolving power in the same manner as the embodiments of FIG. 1 and FIG. 2.

Figure 4:
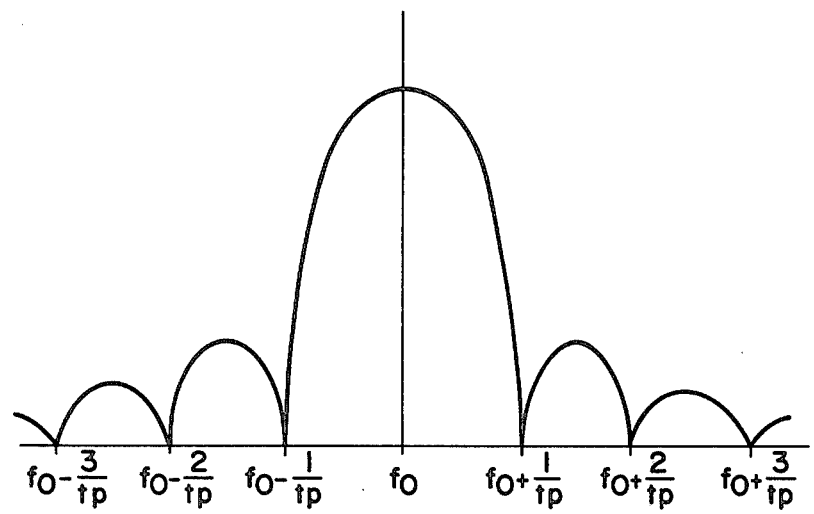
FIG. 4 is a diagram showing the results (power spectra) obtained by Fourier-transforming pulse-like high-frequency waves.

FIG. 4 shows the Fourier-transformed results (power spectrum) of a pulse-like high-frequency wave obtained by modulating a high-frequency wave having a frequency $f_o$ with pulses having a width tp; the power spectrum contains frequency components over a range of 1/tp with the frequency $f_o$ as a center. If the aforesaid pulse-like high-frequency waves are applied to the specimen placed in the unidirectional magnetic field, the nuclei having different chemical shifts can be simultaneously resonated within a frequency range of 1/tp. The region in which the resonance signals are present is usually selected to lie near the central frequency having uniform intensity of frequencies. The intensity of free induction decay signals induced by the detector coil is a value which is exhibited when the magnetization vector of the resonating nuclei is rotated about the axis of the detector coil so as to approach said axis. The amplitude of the pulse-like high-frequency waves is limited by the performance of the amplifier for amplifying said high-frequency waves. Therefore, the intensity of the high-frequency waves is usually adjusted by varying the width of the pulses. However, if the width of the pulses is increased to increase the intensity, the difference in intensity of the frequency components contained in the pulse appears conspicuously as shown in FIG. 4, causing the integrated values to become incorrect when the resonance signals are integrated. The frequency $f_o$ and the magnetic field can also be arbitrarily set, permitting the region in which the resonance signals are present to be deviated beyond the range of 1/tp; in this case, the uniformity of the frequency components may not be maintained. In this way, since the accuracy of integration of the resonance signals may become incorrect, it is necessary to correctly grasp the regions in which are present the frequencies of high-frequency waves and the frequencies of the resonance signals. It is, however, difficult to known the frequency of the pulse-like high-frequency waves applied to the specimen from the obtained resonance spectrum. It is further difficult to know the frequency of the pulse-like high-frequency waves from the free induction decay signals, and it is also difficult to determine whether the frequency of the high-frequency waves is located on the right side or the left side of the resonance signals. It can therefore be proposed to determine the frequency of the pulse-like high-frequency waves applied to the specimen, by using a specimen which is different from the speciment to be measured and of which resonance frequency has been known, and by varying the frequency of the high-frequency waves under a state in which the magnetic field is maintained in a stable state.

Such a method, however, gives a problem in regard to the stability of the high-frequency waves; a specially designed stabilizer circuit will be required to measure the resonance peak of 0.3 Hz, which is economically disadvantageous. The abovesaid method further requires clumsy operation for adjustment as well as relatively sophisticated knowledge.

The resonance condition when the high-frequency waves of a frequency $f_o$ is continuously applied to a reference specimen, for example, to the tetramethylsilane, is given by the following equation, $$f_o + f_{f1} = \gamma_o H_o / 2\pi \quad (1)$$

wherein $H_o$ represents the intensity of the unidirectional magnetic field, $\gamma_o$ a ratio of magnetic gyration, and $f_{f1}$ represents a modulation frequency for modulating the magnetic field $H_o$.

Figure 5:
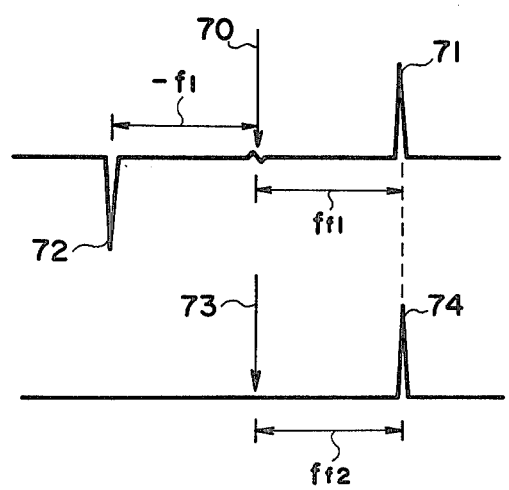
FIG. 5 is a diagram showing relations in positions of frequency between a region of reference resonance signals and a region in which is present the resonance of the specimen.

FIG. 5 is a diagram showing a relation in position of frequencies between a region in which are present the reference resonance signals and a region in which are present the resonance signals of the specimen. Reference numeral 70 represents a position ($f_o$) of a frequency of the continuous high-frequency waves, reference numeral 71 represents an upper side-band wave, and reference numeral 72 designates a lower side-band wave. These two side-band waves are separated apart from the center frequency $f_o$ by $f_{f1}$, respectively.

On the other hand, the following resonance condition holds true for the referece resonance signal 74 when a free induction decay signal obtained by applying a pulse-like high-frequency wave 73 of a frequency $f_o$ to a reference specimen placed in a uniform magnetic field $H_o$, is Fourier-transformed, $$f_o + f_{f2} = \gamma_o H_o / 2\pi \quad (2)$$

wherein $f_{f2}$ represents a component contained in the pulse-like high-frequency waves and has a frequency equal to the difference between the frequency of the pulse-like high-frequency waves and the frequency of the reference resonance signals. With the embodiment of FIG. 3, therefore, it is possible to accurately and easily determine the position of frequency of the pulse-like high-frequency waves employed for the Fourier-transform nuclear gyromagnetic resonance measurement, by setting the frequencies $f_{f1}$ and $f_{f2}$ to be equal ($f_{f1} = f_{f2}$) at the time of measuring the continuous wave nuclear gyromagnetic resonance, modulating the magnetic field using said frequency, and observing the sideband resonance signals at a predetermined position on the cathode-ray tube 55.

Figure 6:
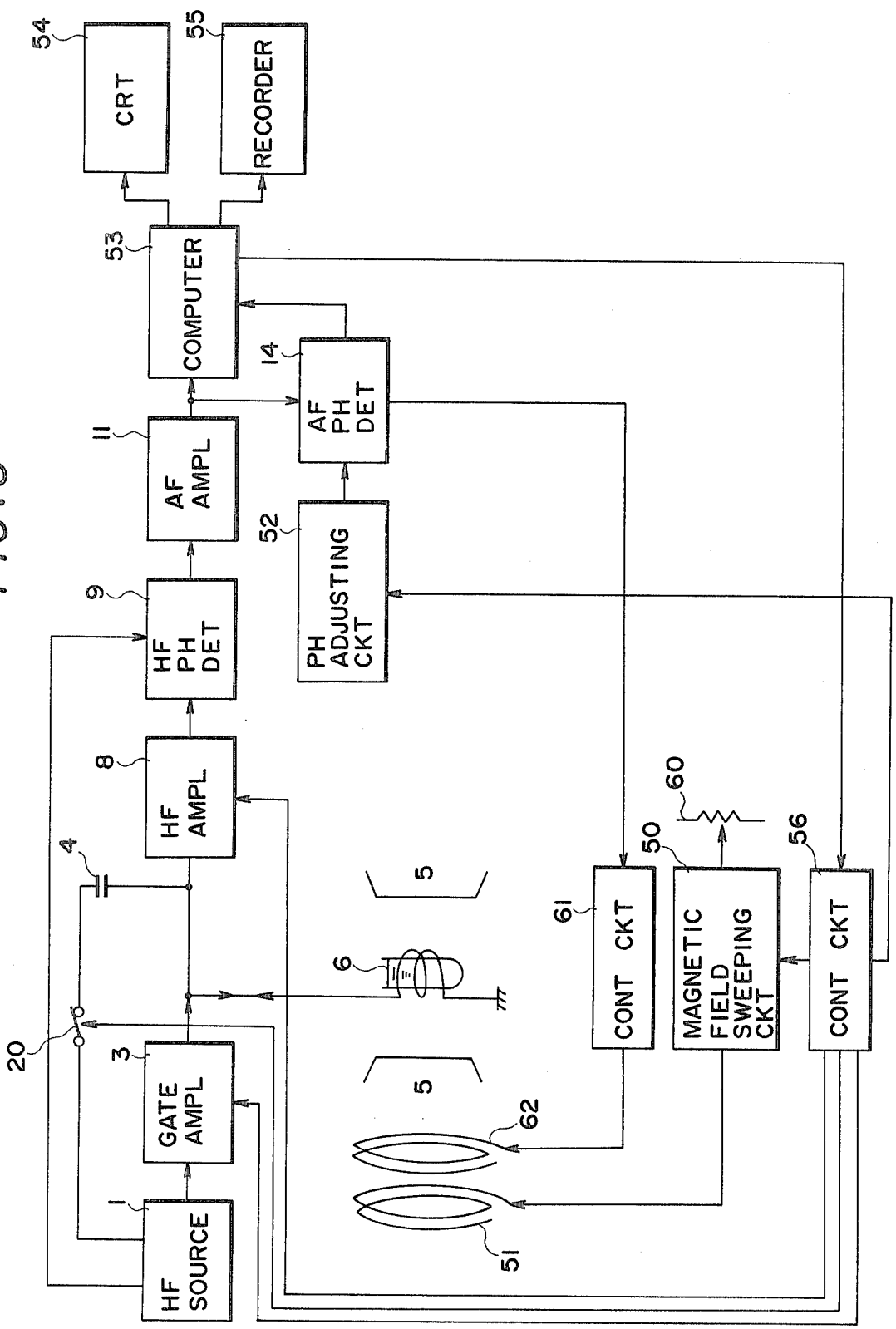
FIG. 6 is a block diagram of a Fourier-transform nuclear gyromagnetic resonance spectrometer showing a still further embodiment according to the present invention.

FIG. 6 shows yet another embodiment according to the present invention. The difference of the embodiment of FIG. 6 from the embodiment of FIG. 3 is that the embodiment of FIG. 6 does not have the audiofrequency generator 12, switch 44 and coil 13 that were used in the embodiment of FIG. 3, but instead, has the switch 20 which is controlled by a gate signal of the controller circuit 56, and in which the gate signal from the controller circuit 56 is applied to the audiofrequency phase detector 14 through the phase adjusting circuit 52. The gate signals fed from the controller circuit 56 to the switch 20 and the audiofrequency phase detector 14 may be in the form of rectangular pulses, but should have the aforementioned frequency $f_{f1} = f_{f2}$. Therefore, in measuring the continuous nuclear gyromagnetic resonance, the switch 20 is opened and closed with the frequency $f_{f1} = f_{f2}$, whereby the high-frequency waves applied by the high-frequency source 1 to the specimen 6 is modulated with the frequency $f_{f1} = f_{f2}$. This means that the magnetic field is modulated in the embodiment of FIG. 3, whereas the frequency is modulated in the embodiment of FIG. 6. The frequency $f_{f1} = f_{f2}$ has also been applied to the audiofrequency phase detector 14, so that the resonance signals are obtained quite in the same manner as the embodiment of FIG. 3. The switch 20 is, of course, opened when the Fourier-transform nuclear gyromagnetic resonance is to be measured. Accordingly, the operation in this case is quite the same as that of FIG. 3. Consequently, the embodiment of FIG. 6 exhibits the same effects as those of FIG. 3.

Although in the foregoing were illustrated some preferred embodiments in accordance with the present invention with reference to the accompanying drawings, it will be obvious for those skilled in the art that many other modifications or changes are possible without departing from the spirit of the present invention. Accordingly, the scope of the present invention shall be limited only by the appended claims.

What is claimed is:

1. A Fourier-transform nuclear gyromagnetic resonance spectrometer comprising:
    means for establishing a unidirectional magnetic field;
    means for placing a specimen in said unidirectional magnetic field;
    means for generating pulse-like high-frequency waves and continuous high-frequency waves having a frequency substantially equal thereto;
    means for selectively feeding said pulse-like high-frequency waves and said continuous high-frequency waves to said specimen, such that resonance signals and free induction decay signals are selectively generated by said specimen;
    means for detecting said resonance signals and free induction decay signals; and
    means for Fourier-transforming said detected free induction decay signals.

2. A Fourier-transform nuclear gyromagnetic resonance spectrometer comprising:
    means for generating continuous high-frequency waves;
    means for establishing a unidirectional magnetic field;

means for placing a specimen in said unidirectional magnetic field;

means for pulse-modulating said continuous high-frequency waves to obtain pulse-like high-frequency waves;

means for selectively feeding said continuous high-frequency waves and said pulse-like high-frequency waves to said specimen, such that resonance signals and free induction decay signals are selectively produced by said specimen;

means for detecting said resonance signals and said free induction decay signals; and means for Fourier-transforming said detected free induction decay signals.

3. A Fourier-transform nuclear gyromagnetic resonance spectrometer comprising;

means for generating continuous high-frequency waves;

means for establishing unidirectional magnetic field;

means for placing a specimen in said unidirectional magnetic field;

means for modulating said continuous high-frequency waves with pulses to obtain pulse-like high-frequency waves;

means for selectively feeding said continuous high-frequency waves and said pulse-like high-frequency waves to said specimen such that resonance signals and free induction decay signals are selectively produced by said specimen;

a high-frequency amplifier for amplifying said resonance signals and said free induction decay signals;

a high-frequency phase detector connected to said high-frequency amplifier;

an audiofrequency gate circuit connected to said high-frequency phase detector;

means for controlling said audiofrequency gate circuit responsive to said pulses in order that said free induction decay signals are produced from said audiofrequency gate circuit when said pulse-like high-frequency waves are fed to said specimen;

means for stopping the operation of said control means so that the gate of said gate circuit is opened when said continuous high-frequency waves are fed to said specimen;

means for Fourier-transforming said free induction decay signals;

an audiofrequency phase detector for detecting said resonance signals; and means for selectively connecting said Fourier-transform means and said audiofrequency phase detector to said audiofrequency gate circuit.

4. A Fourier-transform nuclear gyromagnetic resonance spectrometer according to claim 3, wherein said high-frequency phase detector is composed of a synchronous phase detector for detecting said resonance signals and said free induction decay signals with said continuous high-frequency waves as reference signals.

5. A Fourier-transform nuclear gyromagnetic resonance spectrometer according to claim 4, said spectrometer further comprising means for generating audiofrequency signals that will be used for modulating said unidirectional magnetic field, wherein said audiofrequency phase detector detects said resonance signals with said audiofrequency signals as reference signals.

6. A Fourier-transform nuclear gyromagnetic resonance spectrometer comprising;

means for generating continuous high-frequency waves;

means for establishing a unidirectional magnetic field;

means for placing a specimen in said unidirectional magnetic field, said specimen containing a reference substance;

means for pulse-modulating said continuous high-frequency waves to obtain pulse-like high-frequency waves;

means for selectively feeding said continuous high-frequency waves and said pulse-like high-frequency waves to said specimen, such that resonance signals and free induction decay signals are selectively generated from said reference substance;

means for modulating either one of said unidirectional magnetic field or said continuous high-frequency waves by means of a frequency which is equal to the difference between the frequency of said continuous high-frequency waves and the frequency of the resonance signals of said reference substance when said continuous high-frequency waves are fed onto said specimen, so that said resonance signals will contain a resonance signal component corresponding to the frequency of said difference;

means for detecting resonance signal components corresponding to the frequency of said difference and said free induction decay signals; and means for Fourier-transforming said detected free induction decay signals.

7. A Fourier-transform nuclear gyromagnetic resonance spectrometer according to claim 6, said spectrometer further comprising;

means for stopping the operation of the means which modulates either one of the continuous high-frequency waves or the unidirectional magnetic field, when said pulse-like high-frequency waves are fed onto said specimen; and means which, when said pulse-like high-frequency waves are fed to said specimen, compares the frequency equal to the difference between the frequency of said continuous high-frequency waves and the frequency of resonance signals of said reference substance with the frequency of said free induction decay signals with said frequency of difference as a reference frequency thereby to produce error signals of a frequency between said two frequencies, and which further works to maintain a predetermined relation between said pulse-like high-frequency waves and said unidirectional magnetic field so that the error signals assume a predetermined value.

8. A Fourier-transform nuclear gyromagnetic resonance spectrometer comprising;

means for generating continuous high-frequency waves;

means for establishing a unidirectional magnetic field;

means for placing a specimen in said unidirectional magnetic field, said specimen containing a reference substance;

means for pulse-modulating said continuous high-frequency waves to obtain pulse-like high-frequency waves;

means for selectively feeding said continuous high-frequency waves and said pulse-like high-frequency waves onto said specimen, such that resonance signals and free induction decay signals are selectively generated by said reference substance;

means for modulating said unidirectional magnetic field with signals having a frequency equal to the difference between the frequency of said continuous high-frequency waves and the frequency of the resonance signals of said reference substance when said continuous high-frequency waves are fed onto said specimen, so that said resonance signals will contain a resonance signal component corresponding to the frequency of said difference;

means for detecting the resonance signal component corresponding to the frequency of said difference and free induction decay signals; and means for Fourier-transforming said decay signals.

9. A Fourier-transform nuclear gyromagnetic resonance spectrometer according to claim 8, said spectrometer further comprising;

means for stopping the operation of said means which modulates said magnetic field when said pulse-like high-frequency waves are fed to said specimen; and means which, when said pulse-like high-frequency waves are fed to said specimen, compares the frequency equal to the difference between the frequency of said continuous high-frequency waves and the frequency of resonance signals of said reference substance with the frequency of said free induction decay signals with said frequency of difference as a reference frequency thereby to produce error signals of a frequency between said two frequencies, and which further works to maintain a predetermined relation between said pulse-like high-frequency waves and said unidirectional magnetic field responsive to said error signals so that the error signals assume a predetermined value.

10. A Fourier-transform nuclear gyromagnetic resonance spectrometer comprising;

means for generating continuous high-frequency waves;

means for establishing a unidirectional magnetic field;

means for placing a specimen in said unidirectional magnetic field, said specimen containing a reference substance;

means for pulse-modulating said continuous high-frequency waves to obtain pulse-like high-frequency waves;

means for selectively feeding said continuous high-frequency waves and said pulse-like high-frequency waves onto said specimen, such that resonance signals and free induction decay signals are selectively generated by said reference substance;

means for modulating said continuous high-frequency waves with signals having a frequency equal to the difference between the frequency of said continuous high-frequency waves and the frequency of resonance signals of said reference substance when said continuous waves are fed onto said specimen, so that said resonance signal will contain a resonance signal component corresponding to the frequency of said difference;

means for detecting the resonance signal component corresponding to the frequency of said difference and said free induction decay signals;

a computer including means for Fourier-transforming said detected free induction decay signals;

means which stop the supply of said continuous high-frequency waves to said specimen when said pulse-like high-frequency waves are fed to said specimen, which works to produce, as reference signals, a frequency equal to the difference between the frequency of the continuous high-frequency waves and the frequency of resonance signals of said reference substance, which compares the frequency of said difference with the frequency of said free induction decay signals to produce error signals of a frequency between said two frequencies, and which further works to maintain a predetermined relation between said pulse-like high-frequency waves and said unidirectional magnetic field responsive to said error signals so that the error signals assume a predetermined value;

wherein said continuous high-frequency waves are modulated, and the reference signals having the frequency of said difference are produced responsive to the command from said computer.

* * * * *